(12) United States Patent
Gardner et al.

(10) Patent No.: US 7,772,120 B2
(45) Date of Patent: Aug. 10, 2010

(54) CHEMICAL VAPOR DEPOSITION METHOD FOR THE INCORPORATION OF NITROGEN INTO MATERIALS INCLUDING GERMANIUM AND ANTIMONY

(75) Inventors: Jennifer L. Gardner, Hopewell Junction, NY (US); Fenton R. Mc Feely, Ossining, NY (US); John J. Yurkas, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 726 days.

(21) Appl. No.: 11/621,381

(22) Filed: Jan. 9, 2007

(65) Prior Publication Data
US 2008/0164580 A1    Jul. 10, 2008

(51) Int. Cl.
H01L 21/44 (2006.01)
(52) U.S. Cl. .............................. 438/680; 257/E21.536
(58) Field of Classification Search .................. 438/680, 438/758; 257/E21.536
See application file for complete search history.

(56) References Cited

U.S. PATENT DOCUMENTS

| | | | | |
|---|---|---|---|---|
| 3,979,271 A | * | 9/1976 | Noreika et al. | 204/192.25 |
| 3,983,076 A | * | 9/1976 | Rockstad et al. | 252/519.4 |
| 4,119,994 A | * | 10/1978 | Jain et al. | 257/198 |
| 4,782,340 A | * | 11/1988 | Czubatyj et al. | 345/92 |
| 4,845,533 A | * | 7/1989 | Pryor et al. | 257/4 |
| RE38,613 E | * | 10/2004 | Kawai et al. | 438/503 |
| 2007/0010082 A1 | * | 1/2007 | Pinnow et al. | 438/602 |
| 2007/0141786 A1 | * | 6/2007 | Kawagoe et al. | 438/266 |
| 2007/0210348 A1 | * | 9/2007 | Song et al. | 257/246 |
| 2008/0042167 A1 | * | 2/2008 | Chen et al. | 257/202 |

* cited by examiner

*Primary Examiner*—Charles D Garber
*Assistant Examiner*—Stanetta D Isaac
(74) *Attorney, Agent, or Firm*—Scully, Scott, Murphy & Presser, P.C.; Vazken Alexanian

(57) ABSTRACT

A chemical vapor deposition (CVD) method for depositing materials including germanium (Ge), antimony (Sb) and nitrogen (N) which, in some embodiments, has the ability to fill high aspect ratio openings is provided. The CVD method of the instant invention permits for the control of nitrogen-doped GeSb stoichiometry over a wide range of values and the inventive method is performed at a substrate temperature of less than 400° C., which makes the inventive method compatible with existing interconnect processes and materials. In some embodiments, the inventive method is a non-selective CVD process, which means that the nitrogen-doped GeSb materials are deposited equally well on insulating and non-insulating materials. In other embodiments, a selective CVD process is provided in which the nitrogen-doped GeSb materials are deposited only on regions of a substrate in a metal which is capable of forming an eutectic alloy with germanium.

20 Claims, 3 Drawing Sheets

CHEMICAL VAPOR DEPOSITION METHOD FOR THE INCORPORATION OF NITROGEN INTO MATERIALS INCLUDING GERMANIUM AND ANTIMONY

FIELD OF THE INVENTION

The present invention relates to semiconductor devices and to semiconductor device fabrication. More particularly, the invention relates to a chemical vapor deposition method of incorporating nitrogen into a material that comprises germanium (Ge) and antimony (Sb). The material (e.g., nitrogen-doped GeSb) is formed on a surface of a substrate, which may or may include a metal. The present invention also relates to structures which include a layer of the material comprising Ge, Sb and nitrogen.

BACKGROUND OF THE INVENTION

Materials, which may, via suitable temperature excursions, be reversibly switched between two structural phases characterized by different resistivities have the potential to be employed as phase change memory materials. One class of materials having such properties is materials that comprise germanium (Ge) and antimony (Sb). The materials including Ge and Sb are hereinafter referred to as GeSb materials.

In order to fabricate practical memory devices, it will be necessary to deposit such materials upon substrates of substantial topographic complexity. A possible structure for implementing a phase change memory device is a line-and-via structure similar to those found in interconnect wiring structures. In such structures, the phase change material in the narrow via would constitute the active element of the device.

Chemical vapor deposition (CVD) is a promising potential method to deposit GeSb materials. It has been found that the addition of small amounts (on the order of about 10 atomic percent or less) of dopant atoms, such as nitrogen, is a useful technique for modifying the resistivity of these films.

While CVD processes often exhibit desirable conformality, CVD processes frequently are performed at temperatures substantially exceeding 400° C. Such a high deposition temperature severely restricts the choice of materials which may be included in an integrated device. Therefore, CVD processes which are operable substantially below 400° C. are desired.

Low temperature CVD processes are even more desirable for materials comprising at least two different elements selected from Groups IVB, VB, and VIB of the Periodic Table of Elements (IUPAC nomenclature) since several elements such as, for example, antimony (Sb), arsenic (Ar), tellurium (Te), selenium (Se), phosphorus (P) and sulfur (S), exhibit vapor pressure approaching or exceeding 1 mtorr at temperatures as low as 500° C.

Any deposition process for materials including the above-mentioned elements from Groups IVB, VB, and VIB of the Periodic Table of Elements, such as GeSb, would have to compete with a substantial evaporation rate.

In view of the above, there is a need for providing a low temperature (less than 400° C.) CVD process in which nitrogen atoms can be incorporated into a material that comprises germanium (Ge) and antimony (Sb).

SUMMARY OF THE INVENTION

The present invention provides a low temperature (less than 400° C.) CVD deposition method in which nitrogen atoms can be incorporated into a material that comprises germanium (Ge) and antimony (Sb). Such a material is hereinafter referred to as a nitrogen-doped GeSb material.

Standard methods for the deposition of nitrogen into GeSb materials cannot be adapted. The standard method to deposit nitrides is to use precursors comprising a non-nitrogen component(s) of the film and add ammonia (or an organic amine, or more rarely hydrazine or an organic derivative of hydrazine). No such scheme can meet a low temperature deposition requirement, as the nitrogen sources are insufficiently reactive at the desired low temperature. For example, the CVD of silicon nitrogen using ammonia is typically performed at temperatures exceeding 600° C. The same holds true for the alternative nitrogen sources mentioned above. While this is at least a means for high temperature deposition of silicon nitrogen, the use of such high temperatures for materials comprising, for example, Sb, would result in the evaporation of Sb.

The present invention provides a chemical vapor deposition (CVD) method for depositing nitrogen-doped GeSb materials onto a surface of a substrate.

In some embodiments, the inventive method has the ability to fill high aspect ratio openings The term "high aspect ratio" is used herein to denote an opening that has a height to width ratio that exceeds 3:1. The term "opening" denotes a line opening, a via opening, a combined line/via structure, a trench, etc. which can be fabricated using lithography and etching.

In some embodiments of the present invention, the nitrogen-doped GeSb materials are deposited non-selectively onto a surface (located on, or within) of a substrate.

In other embodiments, the present invention provides a CVD method for selectively depositing a nitrogen-doped GeSb material onto at least one preselected surface of a substrate. The preselected surface may be located on, or within, the substrate.

The CVD method of the instant invention permits for the control of nitrogen-doped GeSb stoichiometry over a wide range of values and the inventive method is performed at a substrate temperature of less than 400° C., which makes the inventive method compatible with existing interconnect processes and materials. In accordance with the present invention, nitrogen-doped GeSb materials can be formed of the basic formula $Ge_xSb_yN_z$ wherein x is from about 2 to about 98 atomic %, y is from about 2 to about 98 atomic %, and z is from about 1 to about 20 atomic %.

In general terms, the method of the present invention comprises:

positioning a substrate having an exposed surface in a chemical vapor deposition reactor chamber;

evacuating said reactor chamber including said substrate to a base pressure of less than 1E-3 torr, and preferably less than 1E-6 torr;

heating the substrate to a temperature that is less than 400° C.;

providing an antimony-containing precursor, a germanium-containing precursor and an azide to said reactor chamber; and depositing a material comprising germanium (Ge), antimony (Sb) and nitrogen A) onto said exposed surface of the substrate from said precursors.

In some embodiments of the present invention, the substrate is an interconnect dielectric material that has at least one opening that has an aspect ratio of greater than 3:1 and the inventive method has the ability to selectively fill the at least one opening with a nitrogen-doped GeSb material. In other embodiments, the substrate has a substantially planar surface and the inventive method has the ability to deposit a nitrogen-doped GeSb material onto the exposed surface of the substrate.

In addition to the above method, the present invention also contemplates a method wherein a metal is used to catalyze the deposition of a nitrogen-doped GeSb material.

This aspect of the present invention comprises the steps of:

positioning a substrate in a chemical vapor deposition reactor chamber, said substrate including a region that contains a metal that is capable of forming an eutectic alloy with germanium;

evacuating said reactor chamber including said substrate to a base pressure of less than 1E-3 torr, and preferably less than 1E-6 torr;

heating the substrate to a temperature that is less than 400° C.;

providing an antimony-containing precursor, a germanium-containing precursor and an azide to said reactor chamber; and depositing a material comprising germanium (Ge), antimony (Sb) and nitrogen (N) onto said region of the substrate that contains said metal from said precursors.

In some embodiments of this aspect of the present invention, the substrate is an interconnect dielectric material that has at least one opening that has an aspect ratio of greater than 3:1 and the inventive method has the ability to selectively fill the at least one opening with a nitrogen-doped GeSb material. In this embodiment of the present invention, the metal that is capable of forming an eutectic alloy with germanium is present at the bottom of the at least one opening. In other embodiments, the substrate has a substantially planar surface and the inventive method has the ability to selectively deposit a nitrogen-doped GeSb material on preselected regions of the substrate that includes said metal.

In addition to the above method, the present invention also contemplates a method wherein the metal and the material comprising Ge, Sb and N (nitrogen) are deposited in the same reactor within breaking vacuum. This aspect of the present invention comprises:

positioning a substrate in a chemical vapor deposition reactor chamber;

evacuating said reactor chamber including said substrate to a base pressure of less than 1E-3 torr, and preferably less than 1E-6 torr;

heating the substrate to a temperature that is less than 400° C.;

forming a metal that is capable of forming an eutectic alloy with germanium on a region of said substrate;

providing an antimony-containing precursor, a germanium-containing precursor and an azide to said reactor chamber; and depositing a material comprising germanium (Ge), antimony (Sb) and nitrogen (N) onto said region of the substrate that contains said metal from said precursors.

In addition to the above, the present invention also relates to semiconductor structures including the nitrogen-doped GeSb materials. In one embodiment, the semiconductor structure comprises:

a substrate including at least one opening located therein, said substrate having an aspect ratio of greater than 3:1; and a chemical vapor deposited material comprising Ge, Sb and N located within said at least one opening.

In another aspect of the present invention, a semiconductor structure is provided that comprises:

a substrate including a region that comprises a metal; and a material comprises Ge, Sb and N on said metal, wherein said material includes a surface layer of said metal that has a thickness of less than 5 monolayers.

The term "monolayers" is used herein to denote a surface layer of said metal that is one atom thick.

In accordance with this aspect of the present invention, the nitrogen-doped GeSb material is sandwiched between a lower metal layer used to catalyze the growth of the nitrogen-doped GeSb and an upper surface metal layer that forms during the growth of the nitrogen-doped GeSb material. If, prior to the initiation of deposition, the metal is sufficiently thin, the lower metal layer may be vanishingly thin.

DETAILED DESCRIPTION OF THE INVENTION

The present invention, which provides a CVD method for the deposition of nitrogen-doped GeSb material and the structures formed by the same, will now be described in greater detail by referring to the following discussion and drawings that accompany the present application. It is noted that the drawings of the present application are provided for illustrative purposes and, as such, the drawings are not necessarily drawn to scale.

Figure 1A:
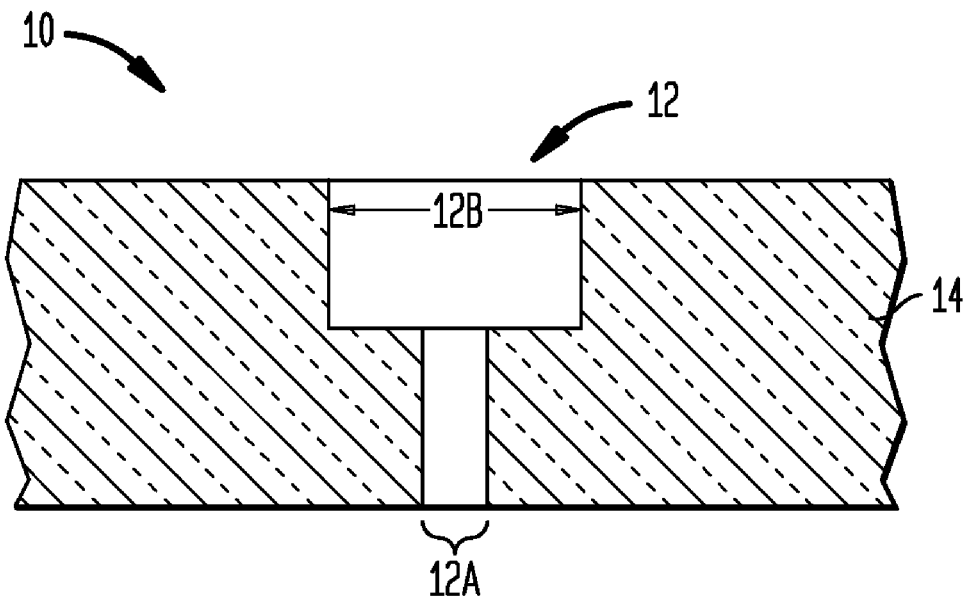
FIGS. 1A-1B are pictorial representations (through cross sectional views) illustrating two types of initial structures that can be employed in the present invention prior to the chemical vapor deposition of a nitrogen-doped GeSb material.
Figure 1B:
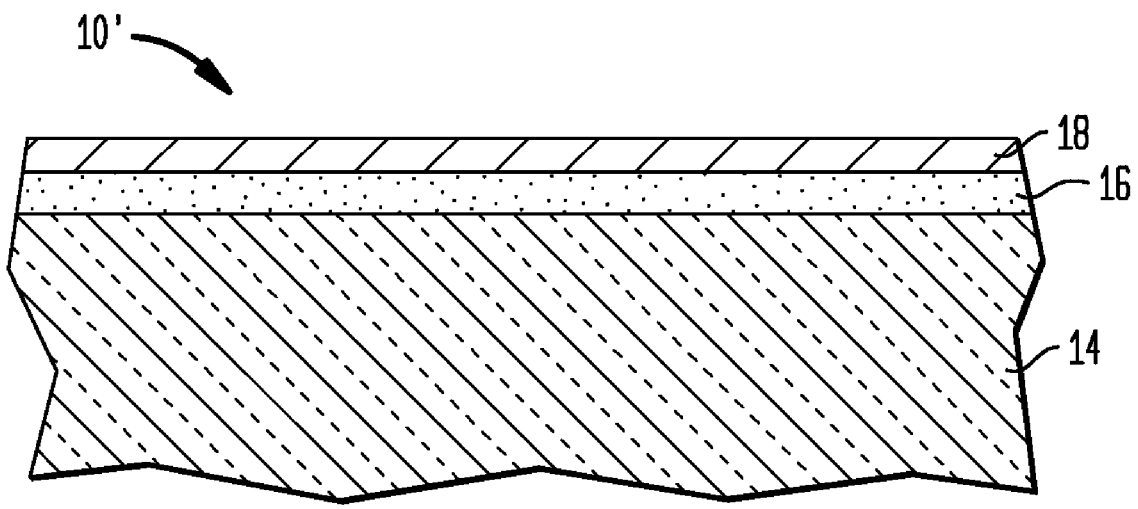

Reference is first made to FIGS. 1A and 1B, which illustrate exemplary substrates that can be employed in the present invention, In FIG. 1A, the initial substrate 10 is an interconnect structure that includes at least one opening 12 located within a dielectric material 14. In accordance with the present invention, the at least one opening 12 of the initial substrate 10 has an aspect ratio of greater than 3:1. The at least one opening 12 illustrated in FIG. 1A includes a via 12A that is located beneath a line 12B, e.g., a line/via structure. Although FIG. 1A shows a single opening 12 in the substrate 10, the present invention is not limited to the same. Instead, a plurality of such openings may be present.

It should be noted that although an interconnect structure including at least one opening 12 is shown and is used as the substrate, the present invention is not limited to the same. Instead, the inventive method can be used to form a blanket layer of a doped-nitrogen GeSb material across a substantially planar surface of a substrate which includes at least one exposed insulating or non-insulating (i.e., semiconducting or conductive) material.

It is further noted that in FIG. 1A a line/via structure is shown by way of example. Hence, the present invention is not limited to such a structure. Instead, other structures having different types of openings, i.e., lines only, vias only, trenches, etc., having an aspect ratio of greater than 3:1, are also contemplated herein.

FIG. 1B illustrates another structure 10' that can be employed in the present invention. In this structure, dielectric material layer 14 is an insulating material that has a substantially planar surface which optionally includes an intermediate adhesion layer 16. In the embodiment shown, a metal 18 is located atop the intermediate adhesion layer 12. In other embodiments, the metal 18 can be formed directly atop the dielectric material 14 when the intermediate adhesion layer 16 is not present.

The dielectric material 14 that is employed in the present invention comprises any insulating material that is used as an interlevel dielectric in interconnect technology. Typically, the dielectric material 14 has a dielectric constant (as measured in a vacuum) of about 4.0 or less, with a dielectric constant of about 3.7 or less being even more typical. Examples of such insulating materials that can be used in the present invention as dielectric material 14 include, but are not limited to: $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

Although not shown, the dielectric material 14 can be typically located upon a substrate. The substrate, which is not shown, may comprise a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other III/V or II/VI compound semiconductors may be used. In additional to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conductive material, the second substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon. When the substrate comprises a combination of an insulating material and a conductive material, the substrate may represent a first interconnect level of a multilayered interconnect structure.

When at least one opening 12 is formed into the dielectric material 14, it is typically formed utilizing lithography and etching. The lithographic process includes forming a photoresist atop a hard mask material (e.g., an oxide and/or a nitride) that is typically located atop the substrate, exposing the photoresist to a desired pattern of radiation and developing the exposed resist. The etching process comprises wet chemical etching and/or dry chemical etching. Of these types of etching processes, a dry chemical etching process such as reactive ion etching, ion beam etching or plasma etching is preferred. In the case of a line/via structure, a conventional via-first then line process may be employed. Alternatively, a line-first then via process is also contemplated in the present invention.

As stated above, substrate 10' of FIG. 1B may include an optional intermediate adhesion layer 16. The optional intermediate adhesion layer 16 comprises a metal or metal nitride. Examples of suitable metals for the optional intermediate adhesion layer include, but are not limited to: Ti, Ta, Ru, and W.

The optional adhesion layer 16 can be formed utilizing a conventional deposition process including, for example, chemical vapor deposition (CVD), plasma enhanced chemical vapor deposition (PECVD), evaporation, sputtering, plating, metalorgano deposition, and chemical solution deposition. In some embodiments of the present invention, the intermediate adhesion layer 16 can be formed in the same reactor chamber as that of the doped-nitrogen GeSb material without breaking vacuum between depositions.

When present, the optional intermediate adhesion layer 16 typically has a thickness from about 1 to about 6 nm, with a thickness from about 2 to about 4 nm being even more typical.

In the embodiment shown in FIG. 1B, a metal 18 is located atop the intermediate adhesion layer 16. In other embodiments, the metal 18 can be formed directly atop the dielectric material 14 when the intermediate adhesion layer 16 is not present. Notwithstanding which embodiment is employed, the metal 18 comprises any metal that is capable of forming an eutectic alloy with germanium. Illustrative examples of such metals that are capable of forming an eutectic alloy with germanium include, but are not limited to: Au, Al, and Sn. Preferably, Au or Al is employed as the metal 18. More preferably, Au is employed as the metal 18.

The metal 18 may be formed selectively on preselected regions (or areas) of the dielectric material 14 in which the nitrogen-doped GeSb material will be subsequently formed. In the embodiment illustrated, the metal 18 is formed entirely across the structure including the intermediate adhesion layer 16 and the dielectric material 14. In yet other embodiments, the metal 18 may be located on or within a specific region of the structure including the dielectric material 14.

In some embodiments, the metal 18 may be formed on a substrate prior to depositing the dielectric material 14 as substrate 10'. In such an embodiment, the metal 18 would be present entirely underneath the dielectric material 14 and when an opening is formed in the dielectric material 14 a portion of the metal 18 is exposed.

The metal 18 is formed by a conventional deposition process including, for example, CVD, PECVD, sputtering, electroless plating, electroplating, evaporation, chemical solution deposition and metalorgano deposition. In some embodiments, the metal 18 is formed within the same reactor chamber as that of the GeSb material and the depositions occur without breaking vacuum. In some embodiments, deposition, lithography and etching can be used in forming the metal 18 on selective areas of the dielectric material 14, which may optionally include the intermediate adhesion layer 16.

The thickness of the metal 18 that is used in 'catalyzing' the selective deposition of GeSb materials may vary depending on the material used as well as the deposition process used in forming the same. Typically, the metal 18 has a thickness from about 1 to about 50 nm, with a thickness from about 3 to about 10 nm being even more typical.

Figure 2:
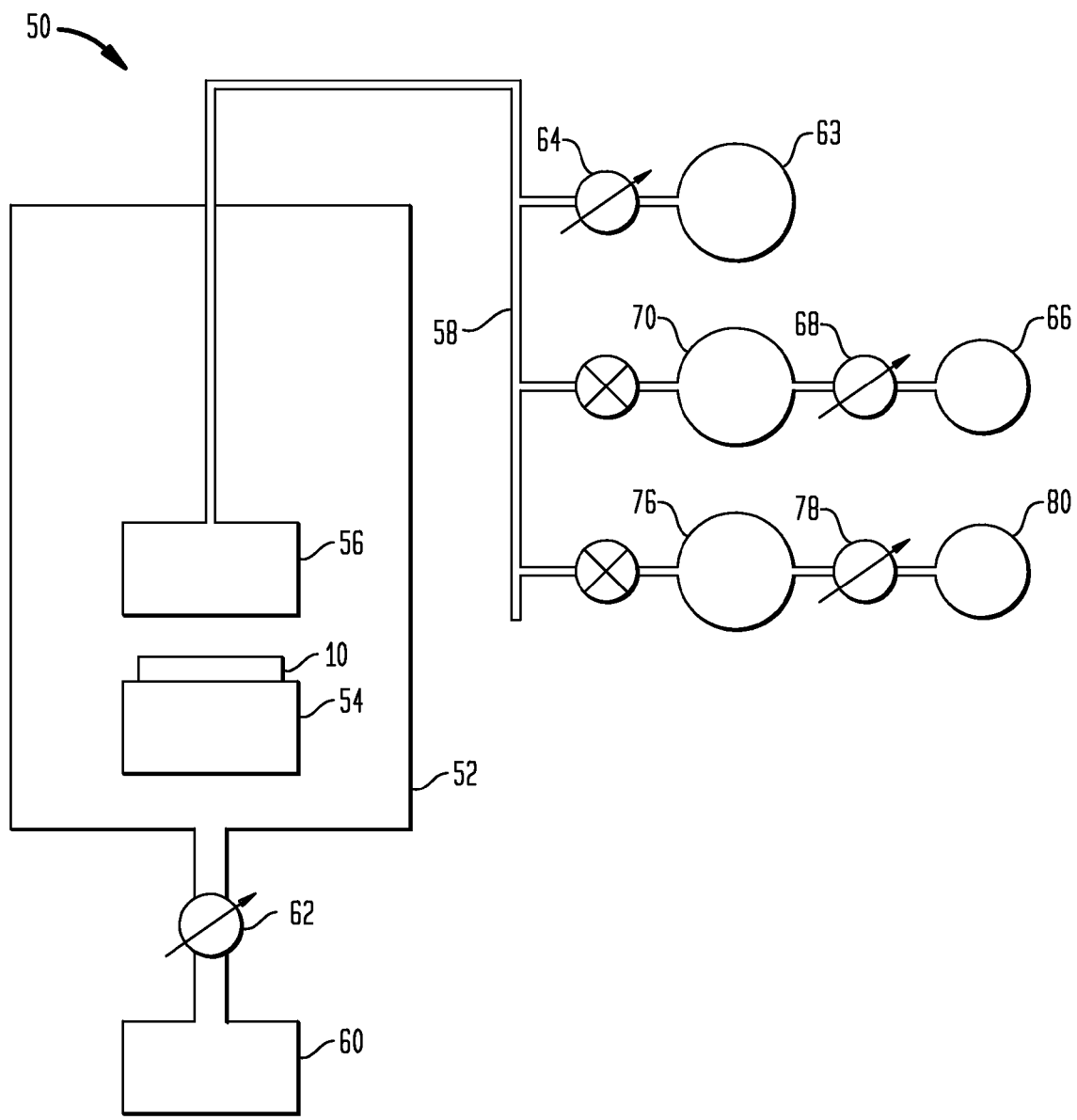
FIG. 2 is a schematic of a chemical vapor deposition apparatus that can be used in one embodiment of the present invention for the deposition of a nitrogen-doped GeSb material.

Reference is now made to FIG. 2 which illustrates a typical chemical vapor deposition (CVD) reactor 50 that may be employed in the present invention to deposit the nitrogen-doped GeSb material on or with at least a region of the structure 10 and 10' shown in FIGS. 1A and 1B. It is noted that although reference is made to the chemical vapor deposition reactor 50 illustrated in FIG. 2, the present invention is not limited to utilizing only such a reactor. Instead, the present invention may be performed utilizing other types of chemical vapor deposition reactors that are well known to those skilled in the art. Other types of reactors that can be employed in the present invention are elaborated further herein below.

Referring back to CVD reactor 50, the CVD reactor 50 includes a reactor chamber 52 in which the initial structure is positioned within. The reactor chamber 52 is typically a vacuum enclosure including, a substrate holder 54, a showerhead 56 that is connect to an intake manifold 58, and a vacuum pump 60, such as a turbo molecular pump, that can be open or shut by a valve 62.

In accordance with the present invention, the initial structure is positioned on a surface of the substrate holder 54 that is located within the CVD reactor chamber 52. A distance from about 5 to about 80 mm typically separates the initial structure from the showerhead 56. Although such a distance is specifically mentioned, the present invention is not limited to the recited distance.

With the initial structure positioned within the reactor chamber 52, the pressure within the reactor chamber 52 is evacuated to a base pressure of less than 1E-3 torr, with a base pressure of less than 1E-6 torr being more preferred. The evacuation to this base pressure is achieved by opening the value 62 to vacuum pump 60.

In some embodiments of the present invention, the substrate holder 54 typically includes a heating element which is capable of heating the initial structure 10 or 10' during the subsequent deposition of the Ge-containing and Sb-containing precursors as well as the azide. In accordance with the present invention, the heating element is capable of heating the initial structure 10 or 10' to a temperature that is less than 400° C., with a temperature from about 250° to about 375° C. being even more typical.

Ge-containing and Sb-containing precursors as well as an azide (i.e., the type of nitrogen containing precursor used in the present invention to provide a nitrogen-doped GeSb material) are then directed to the heated structure by means of showerhead 56. In accordance with the particular embodiment shown, the precursors including the azide are introduced as a gas mixture to the showerhead 56 through intake manifold 58. The precursor gas mixture is formed by admitting a flow of a Ge-containing precursor typically, but not necessarily, in an inert gas from source 63 by means of a mass controller 64 and by flowing an inert gas from source 66 through mass flow controller 68 through bubbler 70 that includes a Sb-containing precursor. The azide is introduced by flowing an inert gas from source 80 through mass flow controller 78 through bubbler 76 that includes an azide as the nitrogen precursor.

The Ge-containing precursor may be a neat Ge-containing precursor, i.e., not including an inert gas, or it may be diluted in an inert gas. The term "inert gas" is used in the present application to denote a gas which does not participate in the formation of the GeSb material. Examples of such inert gases include Ar, Ne, $N_2$, $H_2$, and He, with Ar being highly preferred.

In accordance with the present invention, the Ge-containing precursor comprises any compound or complex which includes Ge. Examples of Ge-containing precursors include germanes such as monogermane, digermane, trigermane and higher germanes, germane alkyls containing from 1 to about 16 carbon atoms, germane hydrides, and other organo-germanes. Preferably, the Ge-containing precursor is a germane (such as digermane) or a germanium alky containing 1 to about 6 carbon atoms such as, for example, tert-butyl germane.

The Sb-containing precursor that can be employed in the present invention comprises any compound or complex that includes Sb. Illustrative examples of such precursors include antimony alkyls containing from 1 to about 16 carbon atoms, antimony amines, antimony hydrides and other organo-antimony containing compounds. In one preferred embodiment of the present invention, the Sb-containing precursor is tris (dimethylamino) antimony.

The azide employed in the present invention comprises any compound or complex that includes an azide moiety, $-N_3$. The azide employed in the present invention thus comprises a compound or complex of the formula A-B wherein B is an azide moiety and A is hydrogen or an alkyl that contains from 1 to 16 carbon atoms, which may optionally include a Si heteroatom. Preferably, the azide is one which does not pose an explosion hazard, with trimethylsilylazide, which does not pose an explosion hazard, being most preferred.

The flow of the three precursors gases employed in the present invention may vary depending on the desired stoichiometry of the resultant nitrogen-doped GeSb material. In accordance with the present invention, the flow of the Ge-containing precursor without the presence of an inert gas is from about 1 to about 1000 sccm, a flow of about 10 to about 300 sccm of inert gas containing the Sb-containing precursor is employed, while a flow of about 5 to about 50 sccm of inert gas containing the azide is employed. When an inert gas is present with the Ge-containing precursor, the flow of Ge-containing precursor is typically greater than the flow reported above for the neat Ge-containing precursor. In a preferred embodiment of the present invention, the flow of the neat Ge-containing precursor gas is from about 5 to about 200 sccm, a flow of about 15 to about 50 sccm of inert gas containing the Sb-containing precursor is employed, while a flow of about 10 sccm to about 15 sccm of inert gas containing an azide is employed. In a highly preferred embodiment, about 5 sccm of 20% germane is employed, 20 sccm of Ar containing 20 ml of tris(dimethylamino) antimony is employed, while 10 sccm of Ar through a bubbler apparatus containing 20 ml of trimethylsilylazide is employed. It is understood that flows described above apply to the particular reactor employed. Were another reactor to be employed, e.g., with different volumes delivery line conductance and pumping speed, the preferred flows could deviate substantially from those given above.

It is noted that during the course of the deposition process the pressure within the reactor chamber 52 is maintained at a deposition pressure from about 1 to about 10 torr. Typically, the deposition pressure within the reactor is maintained at a value from about 6 to about 8 torr during the deposition process.

It is further noted that instead of mixing the precursor gasses in a single input manifold as described above and as is illustrated in FIG. 2, the inventive method works equally well for cases where separate manifolds are used for each precursor gas and mixing thereof can take place in the showerhead itself, or in the space between the showerhead and the initial structure. The later is referred to as a post-mixing scheme.

The precursors are typically provided to the initial structure 10 or 10' as a gas mixture, i.e., simultaneously. Although simultaneous contact is typically preferred, the present invention also can be employed when a layer of Ge is first provided utilizing the Ge-containing precursor and then the Sb-containing precursor and azide are provided. In yet another embodiment, the azide is added after both the Ge-containing precursor and the Sb-containing precursor are added.

In accordance with the present invention, a deposition rate of about 2 to about 1000 nm/min of a material comprising Ge, Sb and nitrogen can be achieved, with a deposition rate of from about 20 to about 150 nm/min being even more preferred.

Figure 3A:
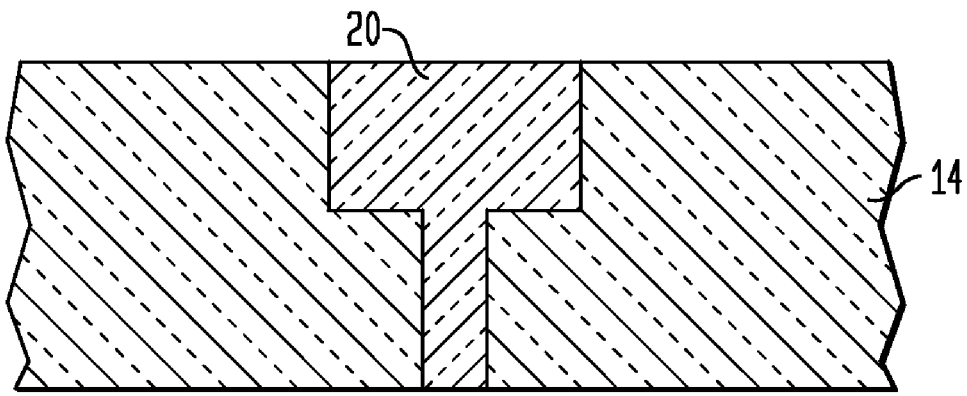
FIGS. 3A-3B are pictorial representations (through cross sectional views) after deposition of a nitrogen-doped GeSb material onto the initial substrates shown in FIGS. 1A-1B utilizing the method of the present invention
Figure 3B:
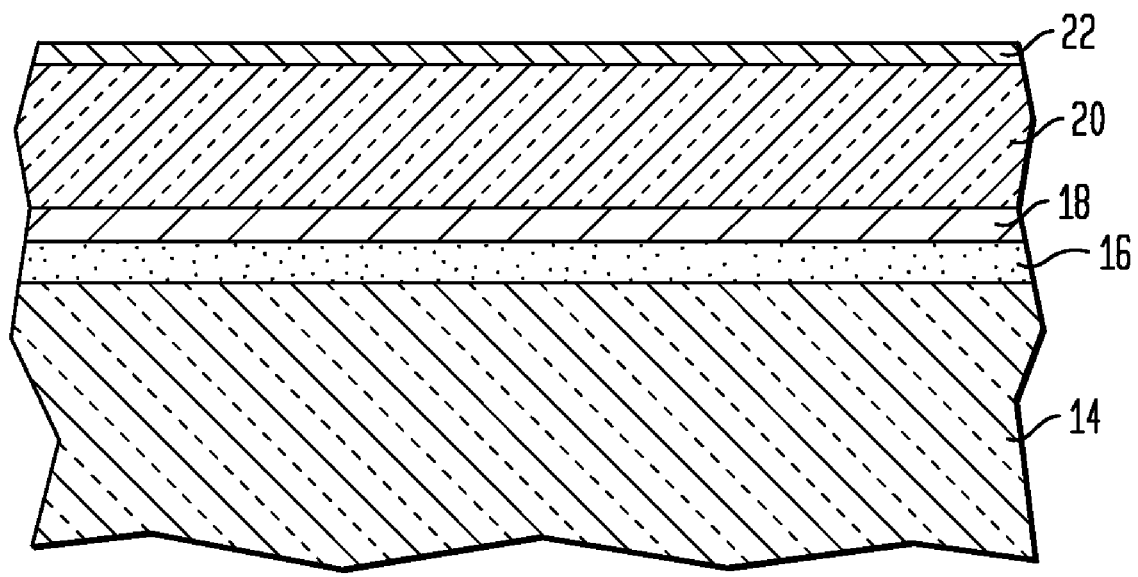

Under the details and embodiment described above, the present invention forms a material comprising Ge, Sb and nitrogen that fills the at least one opening resulting in the structure shown in FIG. 3A or which deposits on the metal 14 resulting in the structure shown in FIG. 3B. The nitrogen-doped material can also be formed on a planar surface of a substrate without the present of a metal. In FIGS. 3A-3B, reference numeral 20 denote the material comprising Ge, Sb and nitrogen (i.e., the nitrogen-doped SiGe material).

In accordance with the present invention, the nitrogen-doped GeSb material 20 has the formula $Ge_xSb_yN_z$ wherein x is from about 2 to about 98 atomic % Ge, y is from about 2 to about 98 atomic % Sb and z is from about 1 to about 20 atomic % N. More preferably, the nitrogen-doped GeSb material 20 provided in the present invention is one wherein x, the atomic percent Ge, is from about 5 to about 20 atomic %, y, the atomic percent Sb, is from about 80 to about 90 atomic %, z, the atomic % nitrogen, is from about 5 to about 10 atomic %.

In the embodiment in which a metal is formed, a surface layer of metal 22 forms on the nitrogen-doped GeSb material 20. In accordance with the present invention, the surface layer of metal 22 comprises the same metal as that of metal layer 18 which is also present in the structure shown in FIG. 3B. The surface layer of metal 22 has a thickness that is less than 5 monolayers thick, with a thickness from about 1 to about 3 monolayers being preferred. The surface layer of metal 22 forms on the surface of nitrogen-doped GeSb material 20 during the growth of layer 20.

While the present invention has been particularly shown and described with respect to preferred embodiments thereof, it will be understood by those skilled in the art that the foregoing and other changes in forms and details may be made without departing from the spirit and scope of the invention. It is therefore intended that the present invention not be limited to the exact forms and details described and illustrated but fall within the scope of the appended claims.

What is claimed is:

1. A method of forming a nitrogen-doped GeSb material on a substrate comprising:
    positioning a substrate having an exposed surface in a chemical vapor deposition reactor chamber;
    evacuating said reactor chamber including said substrate to a base pressure of less than 1E-3 torr;
    heating the substrate to a temperature that is less than 400° C.;
    providing an antimony-containing precursor, a germanium-containing precursor and an azide to said reactor chamber, said germanium-containing precursor is provided first to said reactor chamber to form a layer of Ge, followed by said antimony-containing precursor and said azide; and
    depositing a material comprising germanium (Ge), antimony (Sb) and nitrogen (N) onto said exposed surface of the substrate from said precursors.

2. The method of claim 1 wherein said germanium-containing precursor is a germane, a germane alkyl containing from 1 to about 16 carbon atoms, a germane hydride, or other organo-germanes.

3. The method of claim 1 wherein said antimony-containing precursor is an antimony alkyl containing from 1 to about 16 carbon atoms, an antimony amine, an antimony hydride or other organo-antimony containing compounds.

4. The method of claim 1 wherein said azide is a compound or complex of the formula A-B wherein B is an azide group and A is hydrogen or an alkyl containing 1 to 16 carbon atoms, wherein said compound or complex does not pose an explosion hazard, and wherein said alkyl optionally includes a Si heteroatom.

5. The method of claim 1 wherein said substrate is an interconnect structure having at least one opening therein that has an aspect ratio of greater than 3:1, and said material comprising Ge, Sb and N is deposited within said opening.

6. The method of claim 1 wherein said substrate includes a metal layer that is capable of forming an eutectic alloy with germanium and said material comprising Ge, Sb and N is selectively deposited on said metal layer.

7. The method of claim 1 wherein said base pressure is less than 1E-6 Torr and said temperature is from about 250° C. to about 375° C.

8. The method of claim 1 wherein said depositing is performed at a deposition pressure from about 1 to about 10 torr.

9. The method of claim 1 wherein said depositing is performed at a deposition rate of about 2 to about 100 nm.min.

10. The method of claim 1 wherein said material comprising germanium (Ge), antimony (Sb) and nitrogen (N) has the formula $Ge_xSb_yN_z$ wherein x is from about 5 to about 20 atomic % Ge, y is from about 80 to about 90 atomic percent Sb, and z is from about 5 to about 10 atomic % N.

11. A method of forming a nitrogen-doped GeSb material on a substrate comprising:
    positioning a substrate in a chemical vapor deposition reactor chamber, said substrate including a region that contains a metal that is capable of forming an eutectic alloy with germanium;
    evacuating said reactor chamber including said substrate to a base pressure of less than 1E-3 torr;
    heating the substrate to a temperature that is less than 400° C.;
    providing an antimony-containing precursor, a germanium-containing precursor and an azide to said reactor chamber, said germanium-containing precursor is provided first to said reactor chamber to form a layer of Ge, followed by said antimony-containing precursor and said azide; and
    depositing a material comprising germanium (Ge), antimony (Sb) and nitrogen (N) onto said region of the substrate that contains said metal from said precursors.

12. The method of claim 11 wherein said germanium-containing precursor is a germane, a germane alkyl containing from 1 to about 16 carbon atoms, a germane hydride, or other organo-germanes.

13. The method of claim 11 wherein said antimony-containing precursor is an antimony alkyl containing from 1 to about 16 carbon atoms, an antimony amine, an antimony hydride or other organo-antimony containing compounds.

14. The method of claim 11 wherein said azide is a compound or complex of the formula A-B wherein B is an azide ion and A is hydrogen or an alkyl containing 1 to 16 carbon atoms, wherein said alkyl optionally includes a Si heteroatom.

15. The method of claim 11 wherein said substrate is an interconnect structure having at least one opening therein that has an aspect ratio of greater than 3:1.

16. A method of forming a nitrogen-doped GeSb material on a substrate comprising:
    positioning a substrate having an exposed surface in a chemical vapor deposition reactor chamber;
    evacuating said reactor chamber including said substrate to a base pressure of less than 1E-3 torr;
    heating the substrate to a temperature that is less than 400° C.;
    providing an antimony-containing precursor, a germanium-containing precursor and an azide to said reactor chamber, wherein said germanium-containing precursor is a germane, a germane alkyl containing from 1 to about 16 carbon atoms, a germane hydride, or other organo-germanes, said antimony-containing precursor is an antimony alkyl containing from 1 to about 16 carbon atoms, an antimony amine, an antimony hydride or other organo-antimony containing compounds, and said azide is a compound or complex of the formula A-B wherein B is an azide ion and A is hydrogen or an alkyl containing 1 to 16 carbon atoms, wherein said alkyl optionally includes a Si heteroatom; and depositing a material comprising germanium (Ge), antimony (Sb) and nitrogen (N) onto said exposed surface of the substrate from said precursors.

17. The method of claim 16 wherein said precursors are supplied simultaneously to said reactor chamber.

18. The method of claim 16 wherein said germanium-containing precursor is provided first to said reactor chamber to form a layer of Ge, followed by said antimony-containing precursor and said azide.

19. The method of claim 16 wherein said substrate is an interconnect structure having at least one opening therein that has an aspect ratio of greater than 3:1, and said material comprising Ge, Sb and N is deposited within said opening.

20. The method of claim 16 wherein said substrate includes a metal layer that is capable of forming an eutectic alloy with germanium and said material comprising Ge, Sb and N is selectively deposited on said metal layer.

* * * * *